US008823370B2

(12) United States Patent
Mu et al.

(10) Patent No.: US 8,823,370 B2
(45) Date of Patent: Sep. 2, 2014

(54) HIGH FREQUENCY LOSS MEASUREMENT APPARATUS AND METHODS FOR INDUCTORS AND TRANSFORMERS

(75) Inventors: Mingkai Mu, Blacksburg, VA (US);
Fred C. Lee, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 357 days.

(21) Appl. No.: 13/222,235

(22) Filed: Aug. 31, 2011

(65) Prior Publication Data
US 2013/0049744 A1 Feb. 28, 2013

(51) Int. Cl.
*G01R 33/14* (2006.01)
*G01R 33/12* (2006.01)

(52) U.S. Cl.
CPC ............ *G01R 33/14* (2013.01); *G01R 33/1207* (2013.01)
USPC .......................................................... 324/222

(58) Field of Classification Search
USPC .......................................................... 324/222
See application file for complete search history.

(56) References Cited

U.S. PATENT DOCUMENTS

| | | | | |
|---|---|---|---|---|
| 3,277,366 A | * | 10/1966 | Webb | 324/641 |
| 4,352,075 A | * | 9/1982 | Cunningham | 333/28 R |
| 4,827,214 A | * | 5/1989 | Nakajima et al. | 324/222 |
| 5,249,113 A | * | 9/1993 | Perol | 363/24 |
| 5,371,668 A | * | 12/1994 | Gurwicz et al. | 363/132 |
| 6,668,444 B2 | * | 12/2003 | Ngo et al. | 29/606 |
| 6,700,400 B2 | * | 3/2004 | Atarashi | 318/400.01 |
| 2003/0141953 A1 | * | 7/2003 | Haslett et al. | 336/182 |
| 2006/0006849 A1 | * | 1/2006 | Haslett et al. | 323/247 |
| 2006/0193152 A1 | * | 8/2006 | Ushijima | 363/13 |
| 2008/0106426 A1 | * | 5/2008 | Deaver et al. | 340/657 |
| 2011/0063065 A1 | * | 3/2011 | Douglas et al. | 336/170 |
| 2011/0163738 A1 | * | 7/2011 | Hakoda et al. | 324/127 |
| 2012/0169134 A1 | * | 7/2012 | Choudhary et al. | 307/104 |
| 2012/0249102 A1 | * | 10/2012 | Cuk | 323/282 |

FOREIGN PATENT DOCUMENTS

JP 03221886 A * 9/1991

* cited by examiner

*Primary Examiner* — Patrick Assouad
*Assistant Examiner* — Demetrius Pretlow
(74) *Attorney, Agent, or Firm* — Whitham, Curtis, Christofferson & Cook, P.C.

(57) ABSTRACT

Core loss in an inductor is measured with reduced sensitivity to phase measurement error by connecting a reactive component to resonate with the inductor and thus cancel a portion of the reactive voltage on the inductor; reducing the phase difference between the inductor voltage and current and making the observed power more resistive. The reactive component may be a capacitor for sinusoidal excitation or an inductance such as an air core transformer for arbitrary excitation.

20 Claims, 12 Drawing Sheets

$v_2$ in 10V/div, $v_r$ in 100mV/div, $v_3$ in 2V/div

HIGH FREQUENCY LOSS MEASUREMENT APPARATUS AND METHODS FOR INDUCTORS AND TRANSFORMERS

FIELD OF THE INVENTION

The present invention generally relates to power electronics applications such as power supplies and regulators and, more particularly, to accurate measurement of losses in inductors and transformers used therein for optimization of their design.

BACKGROUND OF THE INVENTION

Virtually all currently available devices that includes any electronic circuits include a power supply circuit to ensure that appropriate power is delivered thereto for the electronic circuits to properly perform their intended functions. Since a power supply circuit does not otherwise contribute to the function of the electronics, its efficiency is of paramount importance since it directly detracts from the overall efficiency of the device. Thus, many sophisticated designs for power supplies, converters and regulators (hereinafter sometimes collectively referenced by the term power circuits) have been developed and have achieved relatively high efficiency which is difficult to increase through circuit design and/or operation.

For this reason, losses attributable to inductors and transformers which are generally included in such power circuits are important concerns. The power circuit cannot be optimally efficient without proper magnetic cores for such passive elements while accurate measurement of inductor and transformer losses is necessary for proper inductor and transformer core design. Further, requirements for so-called point-of-load power circuits where size and power density are particularly critical have favored the use of high frequency switching which complicates loss measurement, as will be discussed in greater detail below.

Unfortunately, no satisfactory technique for measurement of core losses in inductors and/or transformers is currently known. The techniques currently in use for this purpose, while providing reasonably useful results, present difficulties and sources of error such as compensation for winding losses which are difficult to estimate or extreme sensitivity to measurement discrepancy in regard to parameters which are subject to errors that may be engendered in whole or in part by the instrumentation required for the measurement, as will be discussed in greater detail below. Prior to the present invention, no technique has been known which is satisfactory for making measurements of core losses sufficient to support development of optimal core designs for inductors and transformers of power circuits designed for particular applications.

SUMMARY OF THE INVENTION

It is therefore an object of the present invention to provide an apparatus and methodologies for measurement of magnetic core losses in inductors and transformers operating at high frequencies.

In order to accomplish these and other objects of the invention, a method of measuring losses in an inductor or transformer is provided comprising steps of resonating a winding of the inductor or transformer with a reactive component in a series resonant circuit with the winding to cancel a portion of a reactive voltage of a magnetizing inductance of the inductor or transformer, a value of the reactive component being chosen such that a phase difference between a measured voltage across the resonant circuit and a measured current in series with the resonant circuit is less than 80°, and integrating the measured voltage and the measured current.

In accordance with another aspect of the invention, a circuit is provided for measuring losses in an inductor or transformer having a core comprising a sensing winding wound on the core and having one terminal of the sensing winding connected to a terminal of the inductor, a current sensor to measure current through a winding of the inductor or transformer, and a reactive component connected between the terminals of the sensing winding and the inductor or transformer and having a reactance value to resonate with the inductor or transformer such that a phase difference of a voltage across the sensing winding and the current through the inductor or transformer is less than 80°.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
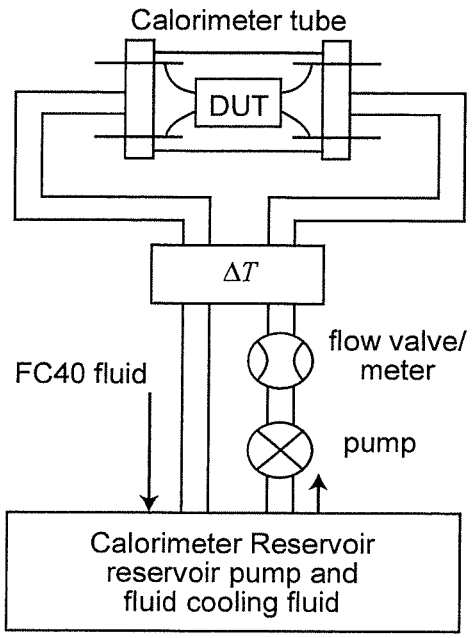
FIG. 1 is a schematic diagram of a known method of measuring losses in a passive device.
Figure 2:
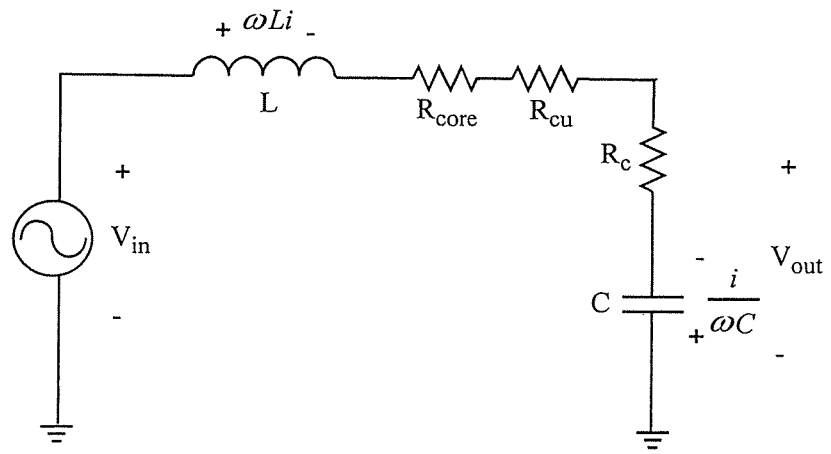
FIG. 2 is a schematic diagram of a known circuit for measuring losses in an inductor or transformer.

Referring now to the drawings and more particularly to FIGS. 1-3, several known measurement methods for obtaining core loss information are illustrated and will be discussed in turn. It is to be understood that, while FIGS. 1-3 do not illustrate the invention and are directed to known measurement methods, the illustrations of FIGS. 1-3 are also arranged to facilitate conveyance of an understanding of the problems addressed and overcome by the invention as well as allowing a more complete appreciation of the meritorious effects of the invention. Therefore, no portion of any of FIGS. 1-3 is admitted to be prior art in regard to the present invention.

One universally applicable and frequency-independent but relatively crude and indirect known approach to loss measurement is through a thermal approach in which the basic method is to put the device under test (DUT) in a thermally isolated chamber through which a fluid is circulated and to measure the temperature difference of the fluid at the inlet and outlet of the thermally isolated chamber and the flow rate of the fluid. The test arrangement is schematically illustrated in FIG. 1. The heat generated by the DUT can then be calculated from the temperature difference, flow rate and specific heat of the fluid. However, since this methodology develops a measurement of total heat generated, it is very difficult to isolate or exclude resistive winding losses of the inductor or transformer when the core losses are principally of interest. The process is also time-consuming since thermal equilibrium or at least stable, steady-state conditions must be achieved within the thermally isolated chamber.

Another loss measurement technique which is applicable to high frequency inductor or transformer excitation, although also indirect, is to connect a capacitor in series with the inductor core under test, as illustrated in FIG. 2. The capacitor is then finely tuned to resonate with the inductor at the test frequency. Because, at resonance, the voltages on the inductor and the capacitor completely cancel each other, the resistance in the RLC network can be easily measured. After compensating for parasitic resistance (similar to the compensation for winding resistance mentioned above) and resonant capacitor equivalent series resistance (ESR), the core loss can be eventually calculated.

This method is not sensitive to phase discrepancy because phase angle is not used in the loss calculation. However winding losses cannot be estimated very accurately and are therefore difficult to compensate. Further, the resonant capacitor value is critical in order to resonate at a given frequency and the technique is applicable only to sinusoidal waveform excitation.

Figure 3A:
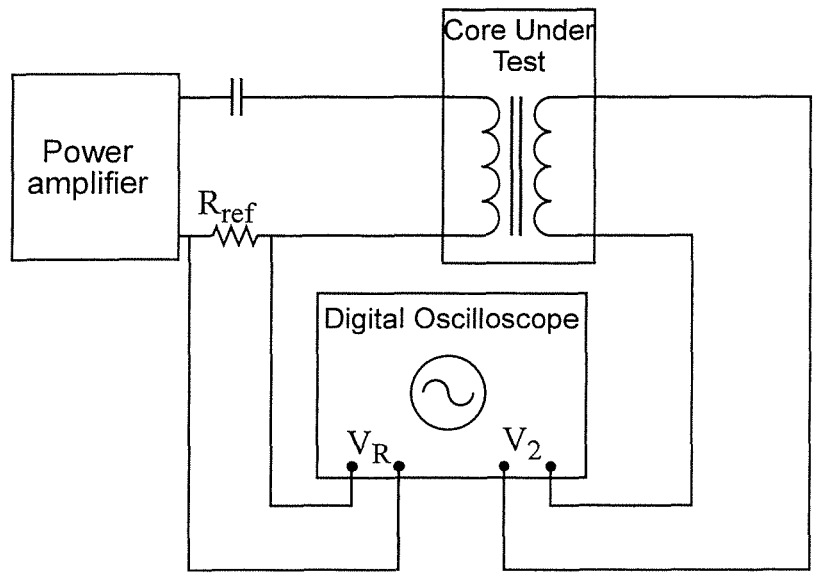
FIGS. 3A and 3B are a schematic diagram of another known method and circuit for measuring losses in and inductor or transformer, respectively.
Figure 3B:
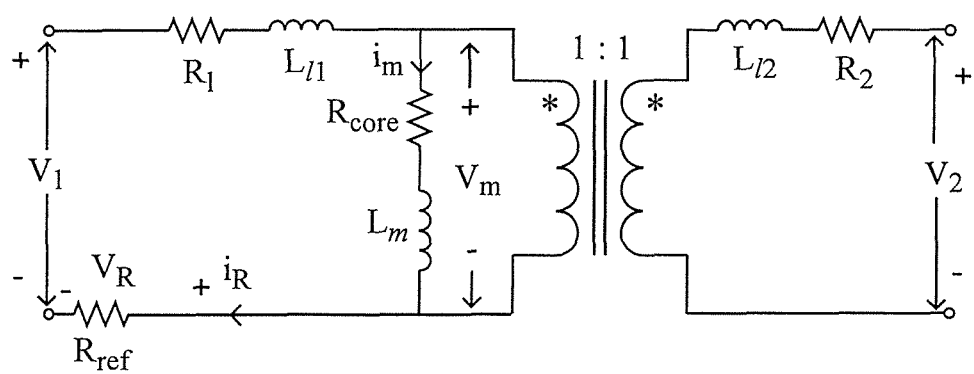

A generally preferable known approach which is potentially accurate and far faster is illustrated in FIGS. 3A and 3B. The DUT carries two windings: an excitation winding and a sensing winding. The current in the excitation winding and the resulting voltage on the sensing winding are measured with an oscilloscope. Integrating the voltage and current waveforms will provide the loss consumed by the core under test. In principle, this method does not present significant drawbacks and, in addition to requiring only a relatively straightforward computation, this technique excludes winding losses; a principal advantage in comparison with the techniques discussed above.

However, in practice, this technique is highly sensitive to phase discrepancies between the measured voltage and current waveforms. Unfortunately, phase discrepancies sufficient to cause significant measurement inaccuracy may easily arise from the measurement instrumentation, itself, as well as from slight inaccuracy in observation of the measured waveforms.

Figure 4:
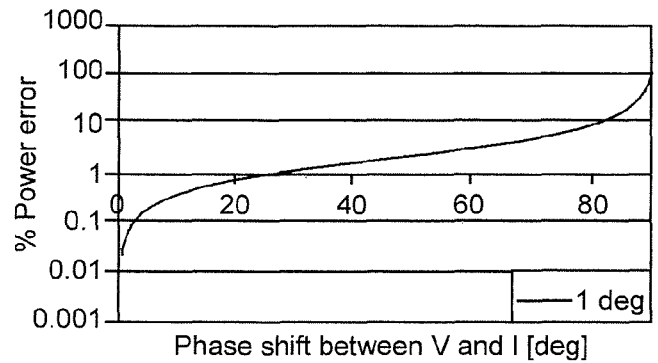
FIG. 4 is a graph of loss measurement error induced by 1° phase error at different phase angles between $v_2$ and $v_R$ in the circuit of FIG. 3B, FIGS. 5A and 5B are a schematic diagram and equivalent circuit, respectively, for core loss measurement in accordance with the invention.

To understand this observed high sensitivity to phase discrepancy, consider the equivalent circuit of FIG. 3B. This method uses the integration between the sensing winding voltage, $v_2$, and the current sensor voltage $v_R$ to obtain the core loss. Because the impedance of the magnetizing inductor $L_m$ is usually very much larger than the equivalent core loss resistor, $R_{core}$, the phase difference between $v_2$ and $v_R$ is very close to 90°. Assuming a sinusoidal excitation, the sensitivity to phase discrepancy is given by:

$$\Delta = \tan(\phi_{v-i}) \times \Delta\phi$$

where $\phi_{v-i}$ is the angle between the two terms (voltage and current) for integration. Thus when the voltage and current have a phase difference near 90°, a small phase discrepancy $\Delta\phi$ will be greatly amplified by $\tan(\phi_{v-i})$ and it can be readily appreciated that a small phase discrepancy can lead to a significant loss error after the integration. For low frequency measurement, the parasitic effect in the test circuit is small and the phase discrepancy is sufficiently small to avoid significant measurement error. However, as frequency increases, small electrical effects such as the parasitic effects of a non-ideal current sensing resistor, mismatch between measurement probes and oscilloscope sampling rate limitation may become significant. Phase discrepancy generally derives principally from the parasitic inductance and capacitance of the current sensing resistor and mismatch between measurement probes and the sampling resolution of the oscilloscope. For example, a 2Ω current sensing resistor having 1nH parasitic inductance will produce a 0.9° phase discrepancy at 5 MHZ. Similarly, for a 5 GS/s digital oscilloscope, the minimum sampling period is 200 picoseconds which is 0.36° at 5 MHZ. FIG. 4 graphically illustrates the loss error induced by a 1° phase discrepancy (less than the sum of the two exemplary phase discrepancies noted in the previous two sentences) at different phase angles between $v_2$ and $v_R$. It can be readily seen that the loss error approaches 100% as the phase shift approaches 90° and that the percentage error in measured loss varies by nearly four orders of magnitude from near 0° to near 90° phase difference between voltage and current. Since these phase discrepancies are inevitable, this classic technique is not a suitable method by which to accurately test for magnetic losses at high frequencies.

Figure 5A:
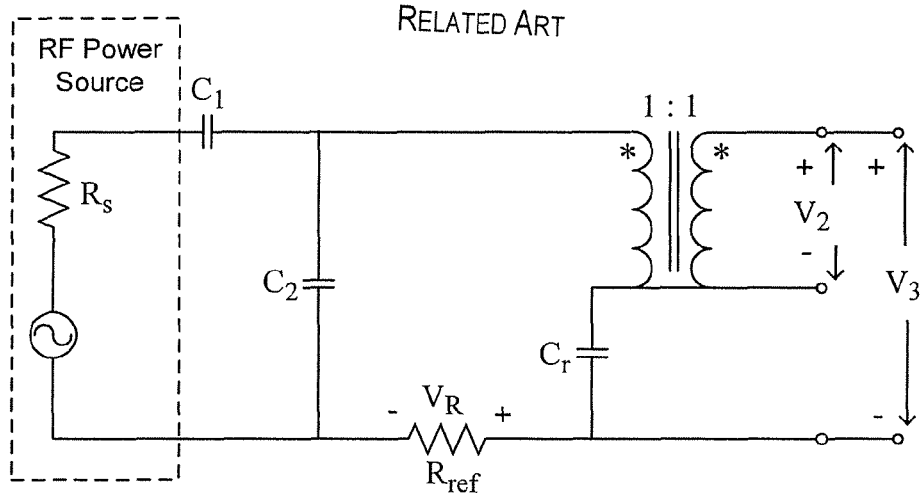
Figure 5B:
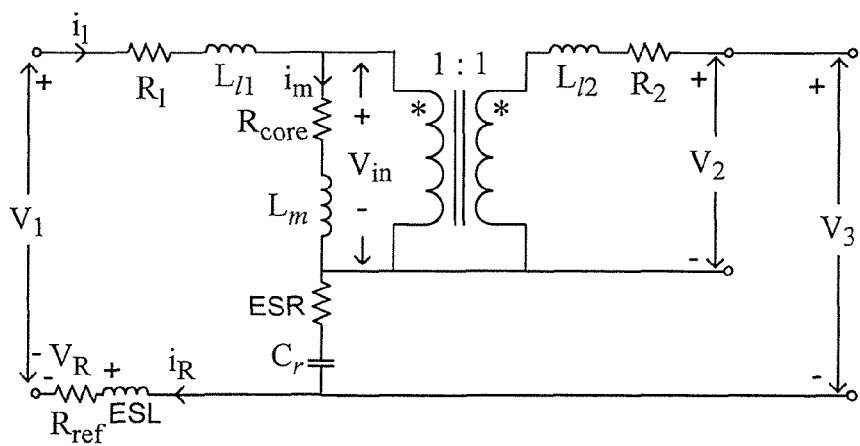

Referring now to FIGS. 5A and 5B, the measurement method and apparatus in accordance with the invention will now be discussed. As with the classic method discussed above, the method in accordance with the invention also uses a core having an excitation winding and a sensing winding. However, one terminal of the sensing winding is connected to the same polarity terminal of the excitation winding and that node is also connected to a resonant capacitor $C_r$. This node connecting the resonant capacitor and the excitation and sensing windings provides an additional voltage, $v_3$, to be monitored in addition to $v_2$ and $v_R$. In such a circuit configuration, $v_3$ is virtually the sum of the sensing winding voltage and the resonant capacitor voltage.

The purpose of adding the resonant capacitor $C_r$ is to cancel the voltage on the magnetizing inductor $L_m$. If $C_r$ and $L_m$ are resonant at the input frequency, their voltages are the same in magnitude but 180° out of phase. As a result, $v_3$ equals the voltage on the equivalent core loss resistor $R_{core}$, and it is in phase with the current through excitation winding $i_R$ (also in phase with current sensor voltage $v_R$). Integration of $v_3 \ast v_R$ will produce the loss consumed on $R_{core}$ because $L_m$ and $C_r$ do not consume real power. As $v_3$ and $v_R$ are in phase, the integration of their product is not sensitive to phase discrepancy.

Although $C_r$ is used to cancel the voltage on the inductor, it is not necessary to completely cancel that voltage. FIG. 4 shows that when the phase angle is 30° the power error is only 1%, which is small enough to facilitate improvement in inductor design. (From FIG. 4, even a phase difference of 80° would limit loss measurement error for a 1.0° phase discrepancy to under 10% which may be adequate to support inductor design improvement.) That means the value of the resonant capacitor $C_r$ could be in a relatively wide range, and does not have to resonate with $L_m$ at the input frequency. It only needs to keep the phase angle between $v_3$ and $v_R$ far from 90°.

The phase angle between $v_R$ and $v_3$ is described in equation (1).

$$\varphi_{v_3 - i_R} = \tan^{-1}\left(\frac{\omega L_m - \frac{1}{\omega C_r}}{R_{core}}\right) \quad (1)$$

By properly choosing the resonant capacitor $C_r$, the phase angle between $v_3$ and $v_R$ can be moved far away from 90°.

If the turns ratio is 1:1, the formulas for the flux density and core loss are $$B = \frac{1}{N_2 A_e} \int_0^T v_2 \, dt \quad (2)$$

$$P_{core} = \frac{1}{TR_{ref}} \int_0^T v_3 v_r \, dt \quad (3)$$

where $N_2$ is the sensing winding turns number, T is the period of the sinusoidal waveform and $R_{ref}$ is the current sensing resistance. If the core under test is a thin toroid core, it can be assumed the flux density that flows in the core is almost uniform. Dividing the core loss by the equivalent volume $V_e$, the core loss density at the specific flux density can be obtained. Thus the core loss density is $$P_v = \frac{1}{TR_{ref} V_e} \int_0^T v_3 v_r \, dt \quad (4)$$

It should be noted is that $v_3$ can not be obtained by measuring $v_2$ and $v_c$ separately and then summing them. Because the value of $v_3$ is much smaller than $v_2$ and $v_c$, a small error percentage of $v_2$ or v, will produce significant error in $v_3$. So the cancelled voltage $v_3$ should be measured by a single probe. For the turns ratio, it could be a different value other than 1:1. However, it is preferred to choose 1:1 symmetric windings, because this will automatically guarantee the effective turns ratio to be 1:1, regardless of the leakage inductance. In addition, a 1:1 turns ratio allows a bifilar winding to be used which will reduce the parasitic capacitances of the transformer. For the current sensing resistor, to reduce the phase discrepancy caused by its equivalent series inductance (ESL), multiple resistors can be connected in parallel. However, too many resistors in parallel will cause additional leading parasitic inductance, so only a few current sensing resistors in parallel are preferred. For the probes used in the test circuit, they should be the same model so that their time delays are identical. To further check that the probes match well, They can be used to test a square wave simultaneously and check if their rising edges are very close to each other on the oscilloscope. In addition, $v_3$ and $v_R$'s probes should be exchanged during test. If two groups of data are in adequate agreement, it can be assumed that their time delay difference will not yield significant error. For the resonant capacitor, a high quality factor capacitor is preferred. The loss on the resonant capacitor is included in the calculated loss. Therefore high Q capacitors like mica or porcelain capacitors are preferred. During the test, the magnetizing inductance tends to change due to environment change, such as temperature, DC flux, etc. Therefore the resonant capacitor should be tuned to keep the phase angle between $v_3$ and $v_R$ far away from 90°.

To verify the efficacy and accuracy of the above-described method, the core loss density of the commercial magnetic material 4F1 (NiZn Ferrite) from Ferroxcube has been tested and compared with its datasheet value. The test arrangement used a toroidal core of 4F1 material with an outer diameter of 21 mm, and inner diameter of 20 mm and a thickness of 3 mm sample wound as a transformer and the excitation winding driven by a commercially available power amplifier (Amplifier Research 25C250A) which was, in turn, driven by a 10 MHZ sine wave from a commercially available function generator. The core under test was immersed in thermal oil heated by a hot plate and its temperature controlled by a thermal coupler to be 100° C. The waveforms monitored by oscilloscope are shown in FIG. 6.

Figure 6:
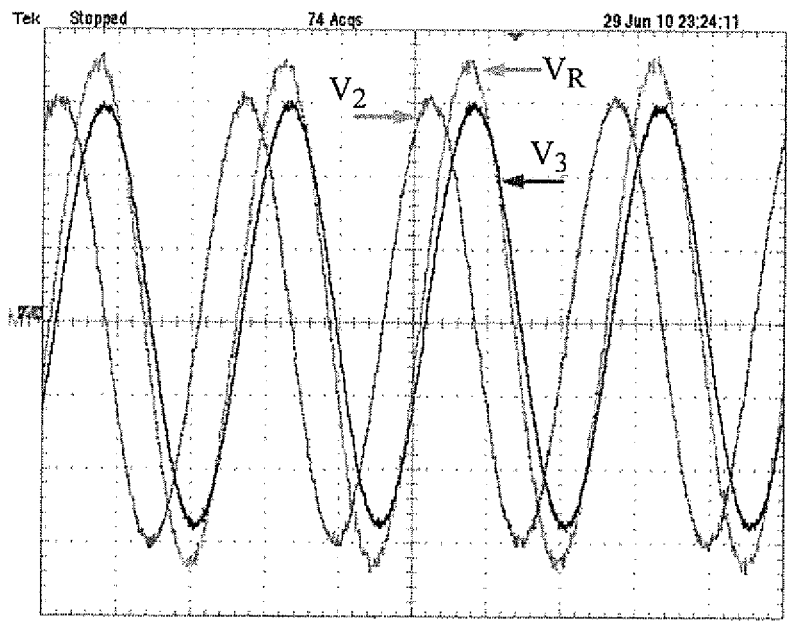
FIG. 6 is a graph illustrating working waveforms in the circuit of FIG. 4A.
Figure 7:
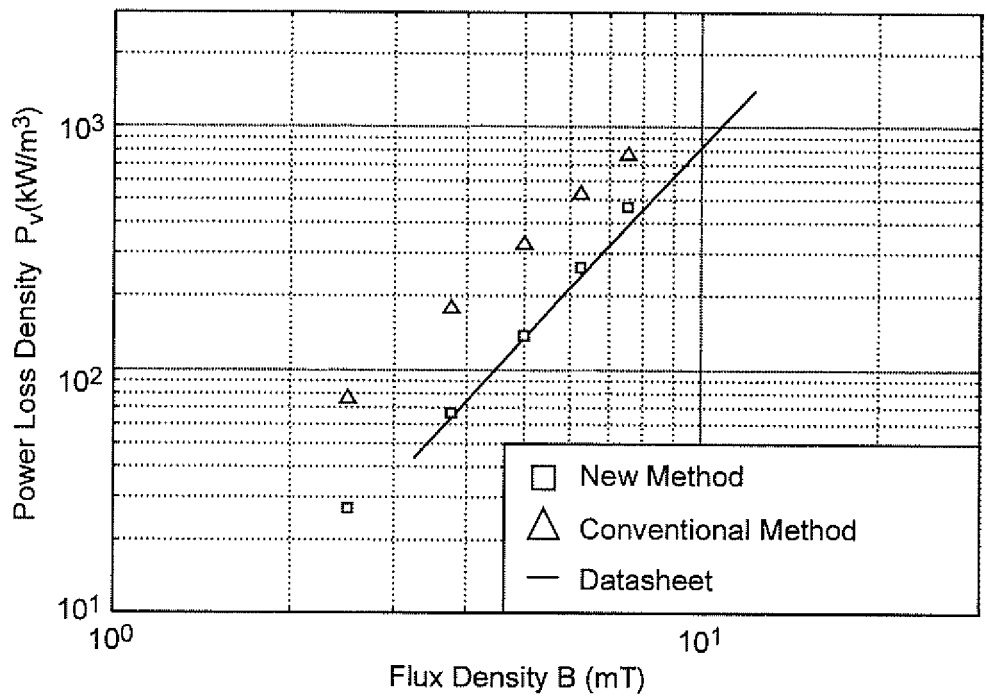
FIG. 7 illustrates a graphical comparison of measurements using the methodology of the present invention and known methodologies with datasheet information for a commercially available core material.

From FIG. 6, it is seen that $v_2$ leads $v_R$ by 4.2° which is far away from 90° and integration of those waveforms will thus have much reduced phase discrepancy induced error. When the results of integration and power loss density is determined, the measured power loss density is in extremely good agreement with the data sheet information for the commercially available core being tested as graphically shown in FIG. 7 and in far better agreement with datasheet information (which is believed to have been determined by the thermal method alluded to above) than the conventional measurement method discussed above.

Figure 8:
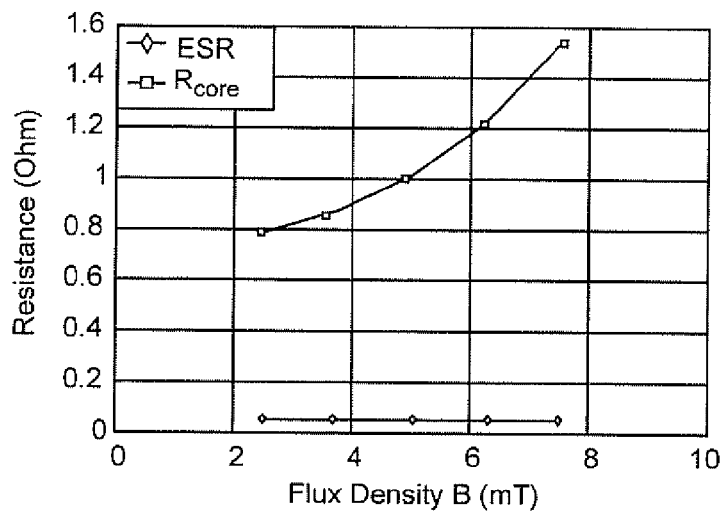
FIG. 8 is a graphical comparison of equivalent series resistance of a resonant capacitor with $R_{core}$ as a function of flux density.

To summarize, the sources of error in the above measurement method in accordance with the invention are phase discrepancy, error caused by the equivalent series resistance (ESR) of the resonant capacitor and error due to the parasitic capacitance of the sensing winding of the transformer. As stated above, the phase error is greatly reduced to below 5% if the phase angle is properly adjusted. From FIG. 2, it is seen that if phase discrepancy is below 1°, a 30° phase angle between $v_3$ and $v_R$ is enough to guarantee that the error in measured loss is less than 1%. The measured power loss can be converted into the equivalent core loss resistance $R_{core}$ shown in FIG. 5B. From FIG. 8, it can be seen that $R_{core}$ is around 1Ω, and varies with flux density, from 0.8Ω to 1.6Ω. (The value of $R_{core}$ is converted from the measured power loss, since the power loss and current are already known. The capacitor ESR is a measured value. Comparison between these two resistor values is straightforward to estimate the error.) To obtain the data illustrated in FIG. 8, two 68 pF mica capacitors (which have very low ESR) were connected in parallel to resonate with the magnetizing inductor. The total measured ESR using this arrangement is about 50 mΩ. This value can then be compared with the measured $R_{core}$ in FIG. 8. Therefore, the error in measured loss due to the ESR of the resonant capacitor is between 3.3% and 6.8%, which is adequately small even though much larger than the loss measurement error due to phase discrepancy. However, if the ESR of the resonant capacitor can be accurately measured or approximated by substitution of resonant capacitors of different constructions, this contribution to total loss error measurement can be compensated.

Figure 9A:
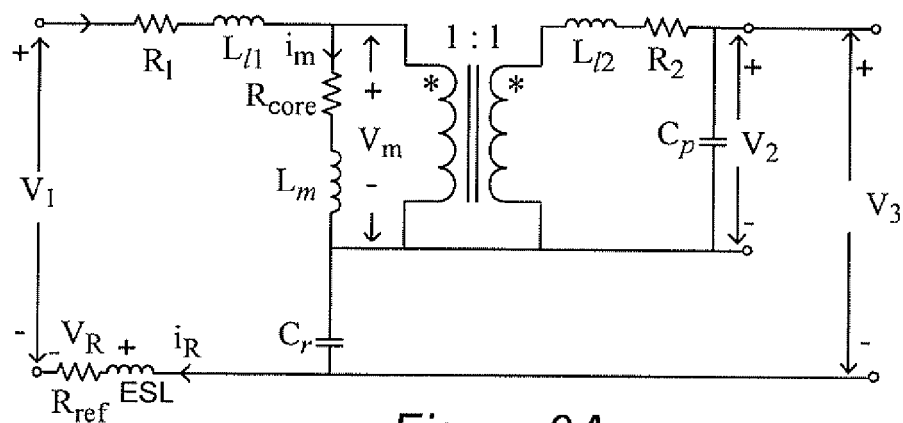
FIG. 9A is a schematic diagram of a circuit useful for understanding effects of parasitic capacitance.

In regard to the error contribution attributable to parasitic capacitance of the sensor winding, because the probe's impedance is not infinite and the transformer has winding parasitic capacitance, there will be a small current flowing through the sensing winding. Usually the probe's input capacitance is larger than transformer winding capacitance. The equivalent circuit including the parasitic capacitor is shown in FIG. 9A. Although $v_3$ and $v_R$ probes also have parasitic capacitance, their loading effect is much smaller than the $v_2$ probe. Because the magnitude of $v_3$ and $v_R$ is much smaller than $v_2$, the currents flowing through the input capacitances of the probes are much smaller than that of the $v_2$ probe. Therefore, analyzing the loading effect of the $v_2$ probe, it can be assumed that the other two probes are open-circuited.

In FIG. 9A, $C_p$ is the total parasitic capacitor in parallel, including the probe's input capacitance and the winding parasitic capacitance. Because of this capacitance, the assumption that secondary winding is open fails at sufficiently high frequency. As a result, a small current flows through $C_p$. This current will induce a voltage drop on the sensing winding's leakage inductor $L_{l2}$ and winding resistor $R_2$. Therefore $v_2$ will have a discrepancy with the voltage on $L_m$ and $R_{core}$, which is $v_m$. When frequency is high, this discrepancy cannot be ignored. Furthermore, current measured by current sensor $i_R$ is not equal to the current flow through magnetizing inductor $i_m$.

To quantify the error caused by the parasitic capacitor, it is assumed that $$R_{core} \ll \omega L_m \quad (5)$$

$$\omega L_m \ll \frac{1}{\omega C_p} \quad (6)$$

$$R_2, \omega L_{l2} \ll \frac{1}{\omega C_p} \quad (7)$$

Under these assumptions, the error percentage can be approximated as:

$$\Delta = \frac{P_{measured} - P_{actual}}{P_{actual}} \quad (8)$$

$$= \frac{\int (v_3 i_R - v_m i_m) dt}{\int v_m i_m dt} \approx \frac{R_2}{R_{core}} \omega^2 L_m C_p$$

The derivation of this approximation equation is unimportant to an understanding of the invention or its practice, particularly since simulation proves that this approximation equation can adequately estimate the error caused by $C_p$, if the assumptions in equations (5), (6) and (7) are true.

Figure 9B:
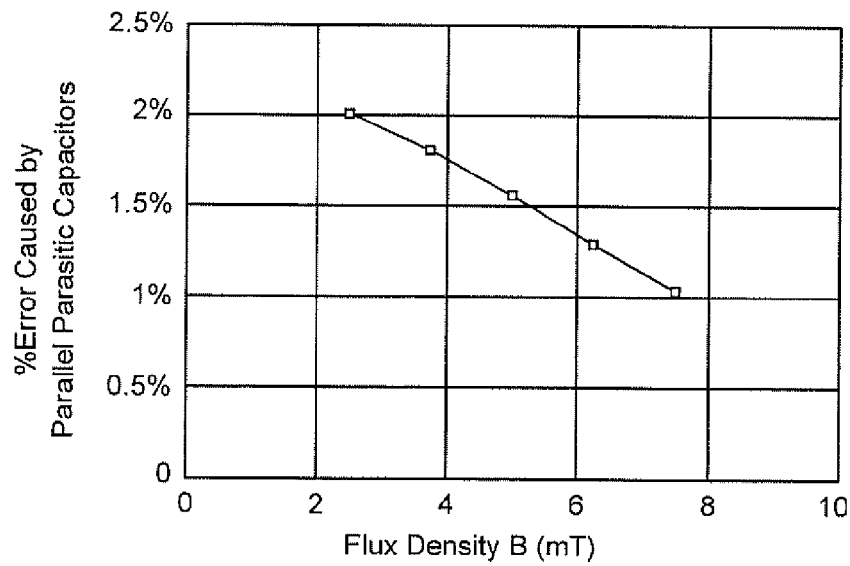
FIG. 9B is a graph of measurement error caused by parasitic capacitance of a sensing winding as a function of flux density.

For the above 4F1 core measurement example, the following parameters can be estimated: $C_p \approx 10$ pF, $L_m = 2$ μH, $R_2 = 0.2$, $\omega = 2\pi \times 10$ MHz. With the value of $R_{core}$ in FIG. 8, the error percentage for different flux density can be calculated. Details of this calculation are not important to an understanding or the successful practice of the invention. The result of the calculation is graphically illustrated in FIG. 9B.

Because of the $\omega^2$ term in equation (8), the loss error due to parasitic capacitance of the sensing winding will increase rapidly with frequency. To reduce this error, sensing winding resistor $R_2$ should be small, the ratio of $L_m$ to $R_{core}$ should be small (e.g. the magnetizing inductor quality factor is low as is usually determined by material), and parasitic capacitance $C_p$ should be small. Therefore the parasitic capacitance of the transformer should be well controlled, and a low input capacitance probe is preferred. Also, to reduce the loading effect of the probe, an alternative embodiment of the invention is shown in FIG. 10.

Figure 10:
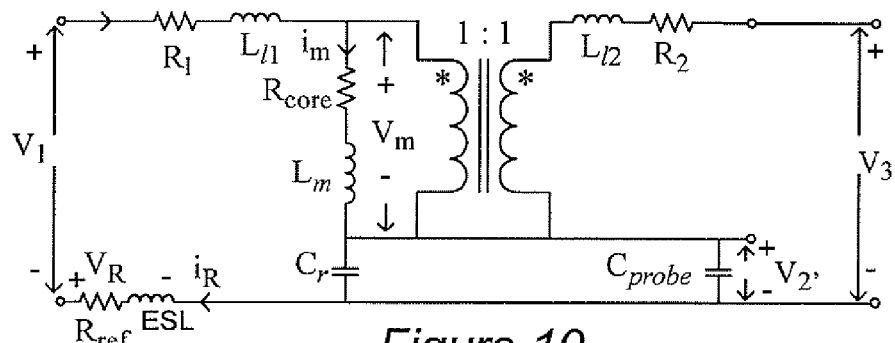
FIG. 10 is a schematic diagram of an embodiment of the invention including an improvement over the circuit and method of FIG. 4A.

The circuit of FIG. 10 measures the voltage on the resonant capacitor $v_2$ rather than measuring the voltage on the sensing winding. By making this alternative measurement, the current through the sensing winding is much reduced and $C_{probe}$ is merged into the resonant capacitor $C_r$. Voltage on the sensing winding can be calculated by simply subtracting $v_2$ from $v_3$.

Figure 11A:
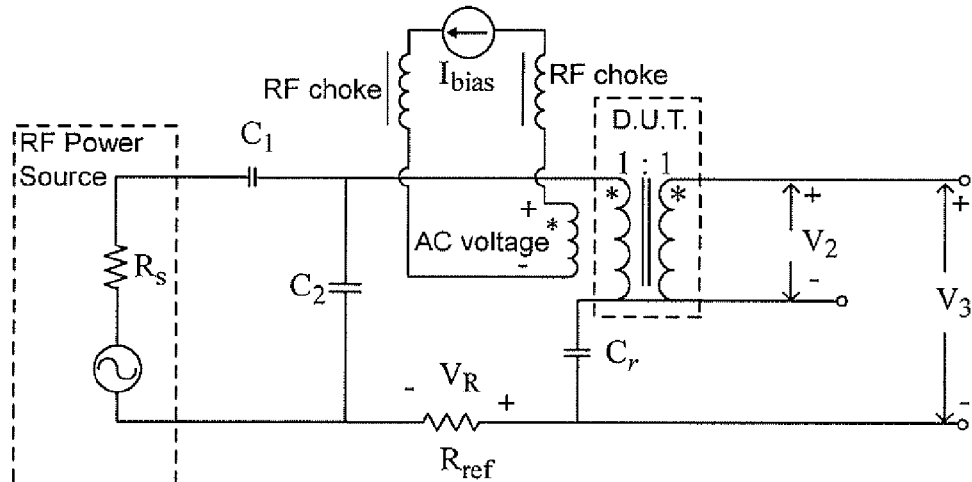
FIG. 11A is a schematic diagram illustrating inclusion of DC flux bias in the circuit and methodology of FIG. 4A.
Figure 11B:
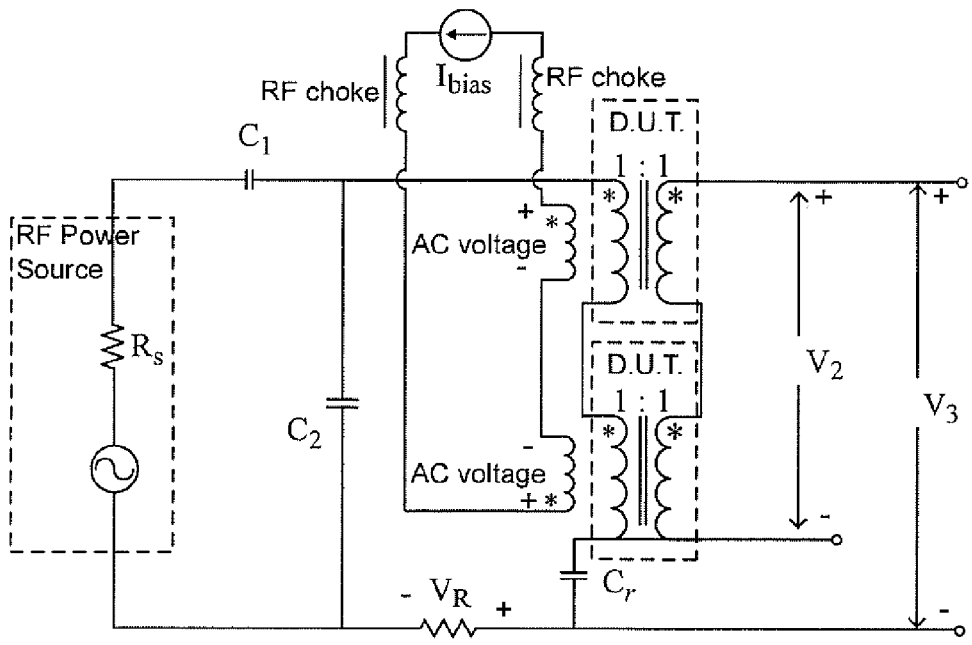
FIG. 11B is a schematic diagram of a circuit for a second embodiment of the invention usable with arbitrary inductor or transformer excitation.

Core loss varies with DC flux bias. Even though DC flux doesn't generate loss directly, it will determine the working point of the flux swing. It is therefore necessary to investigate the AC loss under certain DC flux bias. In the circuit of FIG. 5A and the alternative measurement method described above (FIG. 10), DC flux bias can be conveniently added by adding a third winding and injecting DC current through it. There are two preferred arrangements for doing so. The circuit of FIG. 11A uses one core material sample and adds the DC current through a third winding. The arrangement of FIG. 11B uses two core material samples and the DC windings of the two samples are opposite in polarity. RF chokes are used to attenuate high frequency current induced in the DC winding. The purpose of the preferred arrangement of FIG. 11B is to minimize the AC voltage seen by the RF choke inductors and DC current source so that the AC current through the DC winding is minimized.

Figure 12A:
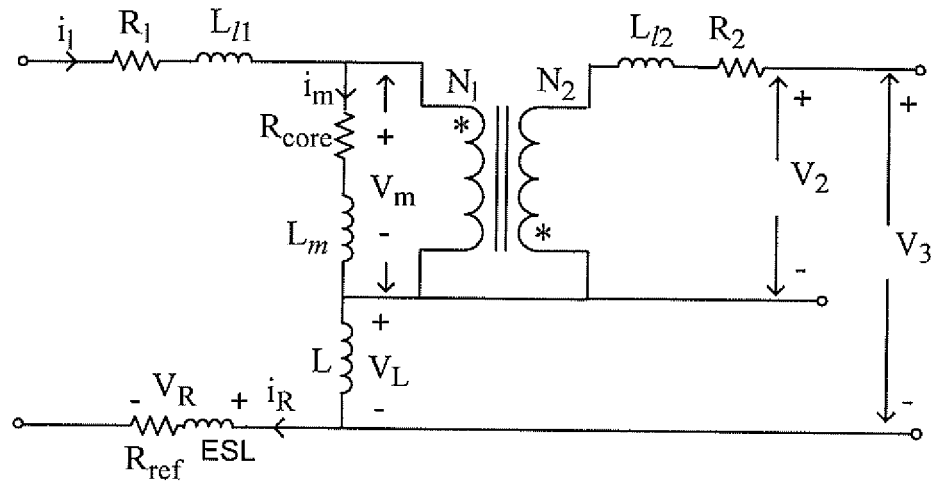
FIGS. 12A and 12B are schematic diagrams of equivalent circuits of the embodiment of FIG. 11B for an inductor and an air core transformer, respectively.

The principle of operation of the circuits discussed above in connection with FIGS. 5A, 10, 11A and 11B borrows the concept of resonance using $C_r$ as the resonant capacitor, to cancel the reactive voltage on the magnetizing inductor so that the phase difference between $v_3$ and $v_R$ may be set close to 0° (rather than near 90°) and the integration of their product will be far less sensitive to phase discrepancy. Although this method reduces the phase sensitivity of the measurement error, it is limited to sinusoidal excitation because the capacitor voltage can only cancel the inductor voltage at a single frequency. To cancel the reactive voltage on the magnetizing inductor for the entire frequency range, the capacitor is replaced with an inductor and the polarity of the transformer is changed, as shown in the alternative embodiment of the invention schematically represented in FIG. 12A. In this embodiment, $v_3$ is the total voltage of the inductor voltage $v_L$ and $-v_m$. That is, $$v_3 = (sL - sL_m - R_{core}) i_m \quad (9)$$

Figure 12B:
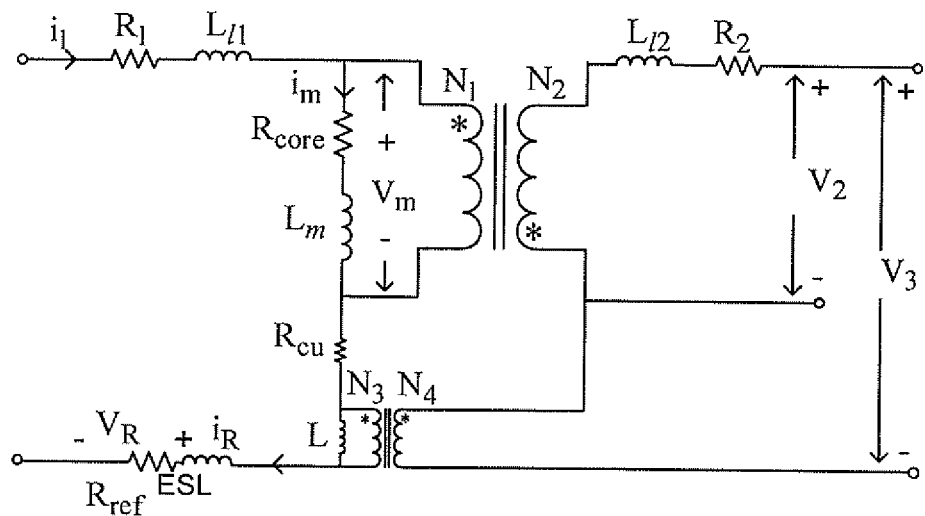

If $L = L_m$, $v_3$ will be the voltage on the equivalent core loss resistor and in phase with the $v_R$. Integration of the product of $v_3$ and $v_R$ will be the loss on $R_{core}$, and even less sensitive to phase discrepancy. However, the winding loss on the added inductor will affect the accuracy of the measured result. To avoid introducing an additional source of measurement error, the circuit of FIG. 12B is preferred. The circuit of FIG. 12B uses the secondary side voltage of an air core transformer to cancel the reactive voltage on the magnetizing inductor. Because the air core does not exhibit core loss, its magnetizing inductor can be used to be an effectively ideal inductor for inductor L in FIG. 12A.

Figure 13:
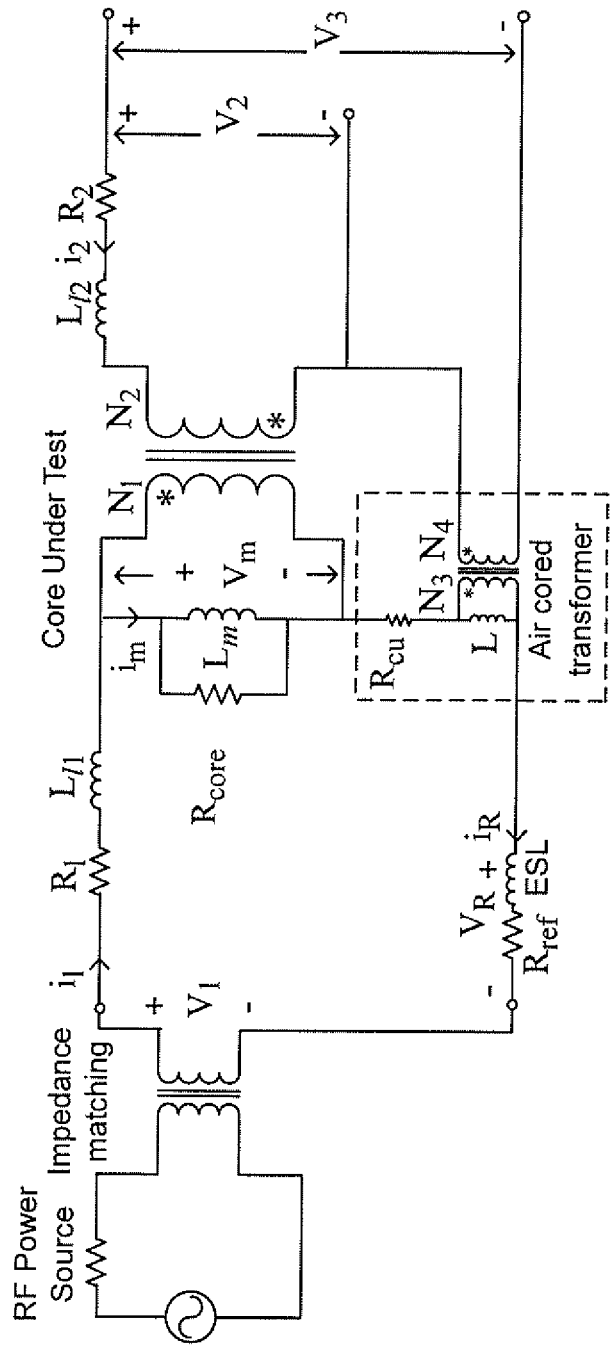
FIG. 13 is a schematic diagram of a complete circuit for the embodiment of FIG. 11B, FIGS. 14A and 14B are graphical depictions of measurement waveforms and variation of core loss density with flux density.

The complete circuit of the preferred embodiment of the invention is shown in FIG. 13. Other than the core-under-test/DUT and the air core transformer, another transformer is used as an impedance transformer to reduce the voltage drop on the internal impedance of the power amplifier alluded to above for driving the core-under-test/DUT. Using this circuit, The core loss can be calculated as $$P_{core} = \frac{1}{TR_{ref}} \int_0^T v_3 v_r \, dt \tag{10}$$

where T is the excitation period and $R_{ref}$ is the current sensing resistance.

The principle of operation of the preferred measurement circuit is that most reactive power in the core-under-test is cancelled by the reactive power in the air core, leaving only resistive power consumed by the core-under-test. If the power is more fully resistive, it will be much easier to be measured. From another perspective, the circuit of FIG. 12B or 13 can be interpreted as comparing the core-under-test with the reference core, which is air core which does not exhibit core losses. The difference in the electrical characteristics of the air core transformer and the core-under-test is then the core loss of the core-under-test.

In some situations, the air core may not be a good choice for the reference core, due to its larger parasitics. Nevertheless, when the inductance value of the core-under-test is high, a large air core transformer is needed and will introduce non-negligible parasitic capacitances. In such a case, a core of (known) low loss could be used as the reference core, and its size and parasitic capacitance can be much smaller than an air core transformer. If its loss is much smaller than the core-under-test, the error can be tolerable and/or suitable compensation made.

Figure 14B:
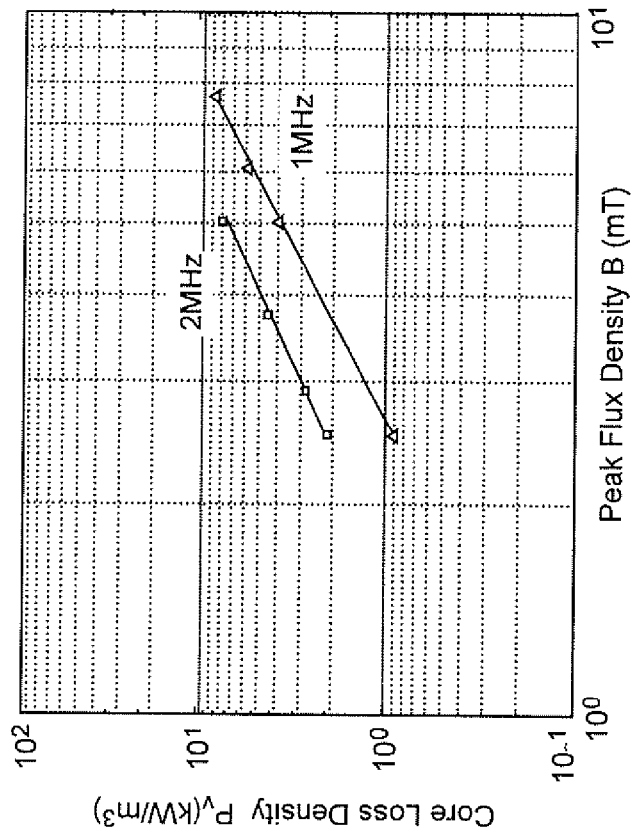
Figure 14A:
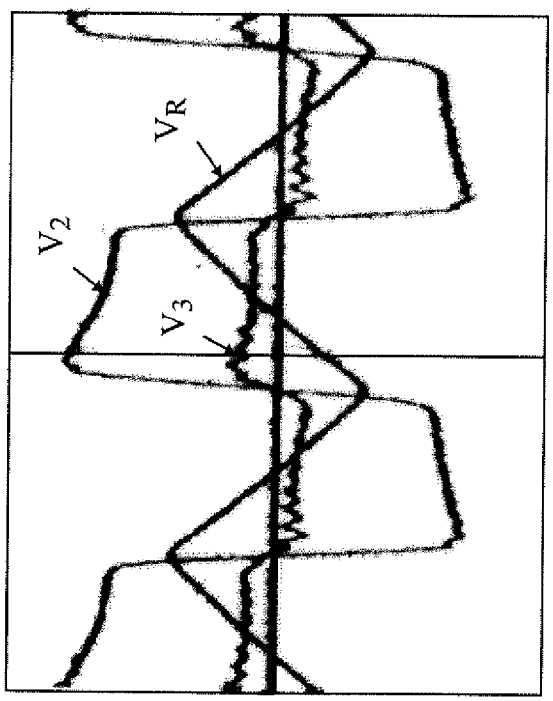
Figure 15B:
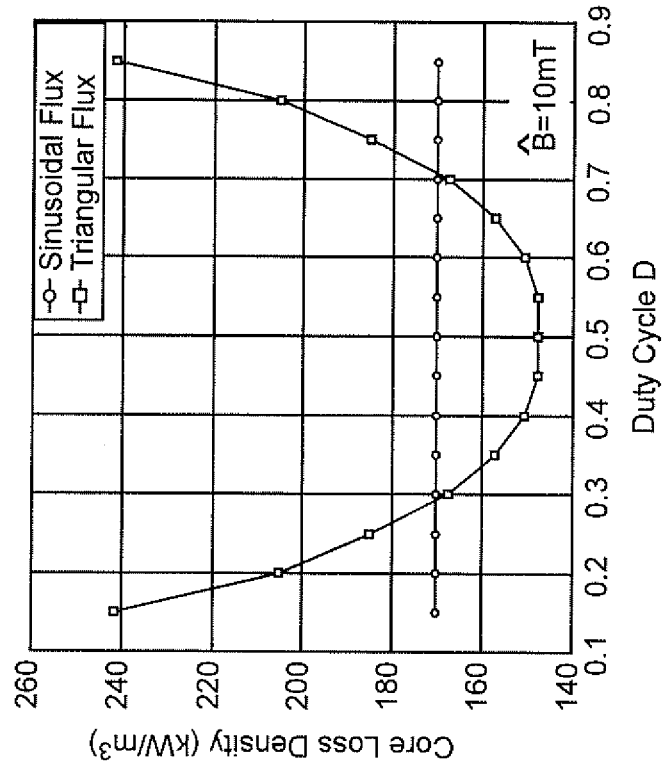
FIGS. 15A and 15B are graphical depictions of measurement waveforms and variation of core loss density with flux density for different excitation waveforms.
Figure 15A:
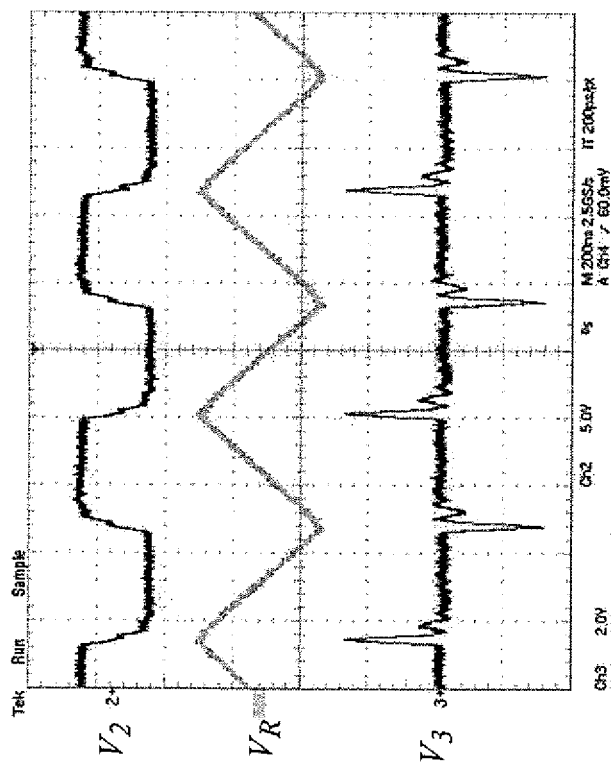

Two experiments have been performed to demonstrate the concept of this embodiment of the invention. The first uses NiZn ferrite toroid core (4F1 from Ferroxcube) as the core under test. The excitation signal is generated by AFG3102 function generator (from Tektronix, and amplified by 25A250A power amplifier (from Amplifier Research. An air core is used as the reference core, and an air core transformer is used to cancel the voltage on the magnetizing inductor of the core-under-test. The voltage on the core-under-test is a 1 MHz or 2 MHz square wave. The measurement waveform and core loss density is shown in FIGS. 14A and 14B. The second experiment is a test of sintered low-temperature co-fired ceramic (LTCC) ferrite material (40011 from ESL ElectroScience). The reference core material is 4F1, and its core loss is controlled much smaller than the loss in LTCC core. The test waveforms and core loss density for sinusoidal and triangular waveforms is shown in FIG. 15.

Figure 16:
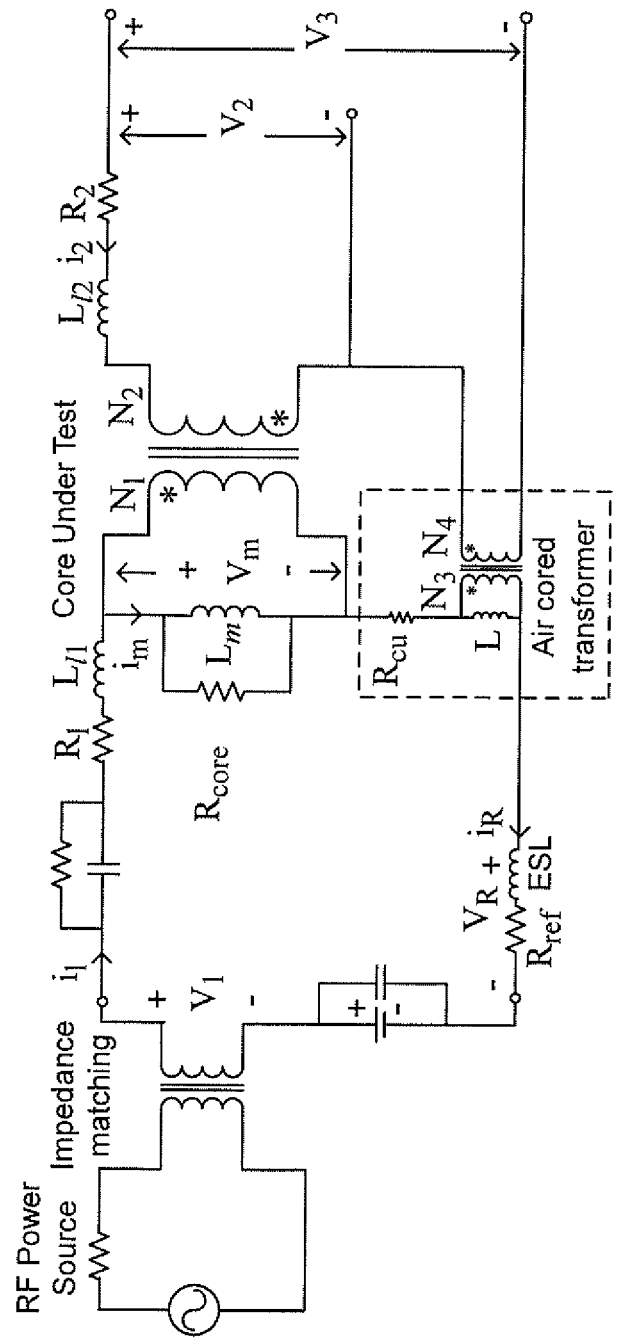
FIG. 16 is a schematic diagram of the core loss measurement circuit of FIG. 13 including DC flux bias.

To measure the core loss under DC flux bias, it is convenient to add the third winding to inject DC current as described above in regard to FIGS. 11A and 11B. Another method to add DC flux is shown in FIG. 16 which directly adds a DC voltage source in the primary winding loop. Thus there will be a DC current flow through the primary winding and the core will then be working under a DC flux bias condition corresponding to the DC component of thee primary loop current. This technique is also applicable to the embodiments of the invention discussed above.

Figure 17:
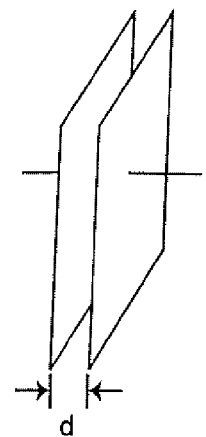
FIGS. 17 and 18 are simplified depictions of an adjustable parallel plate capacitor and an adjustable transformer, respectively.
Figure 18:
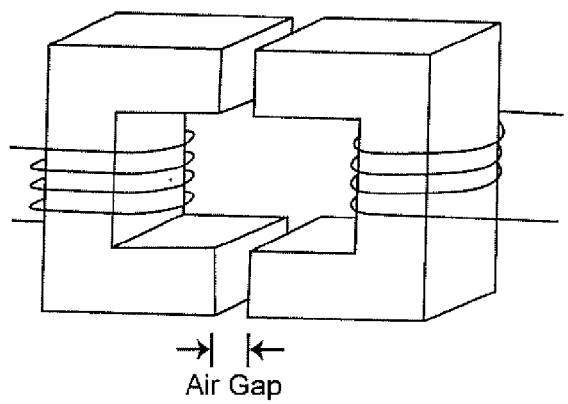

When changing the working condition of the core-under-test, the permeability will change. As a result, the resonant capacitor $C_r$ in sinusoidal excitation embodiments or the transformer L in arbitrary waveform excitation embodiments should be tuned in order to properly cancel the reactive voltage on the magnetizing inductance of the core-under-test. Tuning the capacitor or transformer is difficult if discrete components are used since substitution of fixed capacitors or transformers must be repeatedly mounted and demounted in the test circuit. Therefore, it is preferred for the capacitor value or the transformer's magnetizing inductance value to be made variable and conveniently controlled (or at least easily trimmed with a series of discrete capacitors or inductors. FIGS. 17 and 18 illustrate two examples for controlling the value of a capacitor or magnetizing inductance of a transformer, respectively although numerous other structures for providing variable capacitance or inductance are known and are suitable for the practice of the invention. Specifically, FIG. 17 shows the structure of the tunable parallel plate capacitor. By mechanically adjusting the distance between the parallel plates, the capacitor value can be finely tuned. FIG. 18 shows an exemplary structure for a tunable transformer using two core pieces, each wound with a winding. By mechanically adjusting the air gap between the two pieces, the inductance value of the transformer can be conveniently tuned. With these tunable components, the core loss can be conveniently measured under different conditions.

Figure 19:
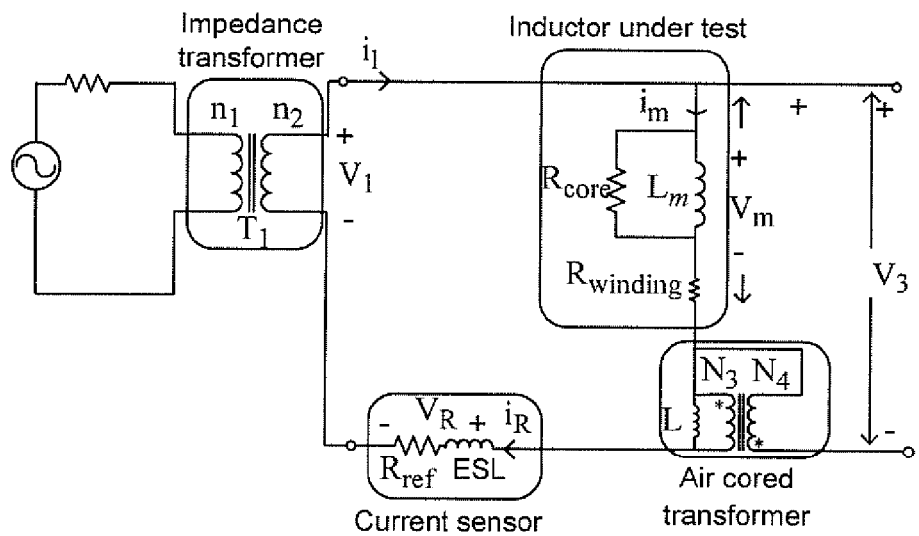
FIG. 19 is a schematic diagram of a an exemplary inductor loss test circuit in accordance with the invention.
Figure 20:
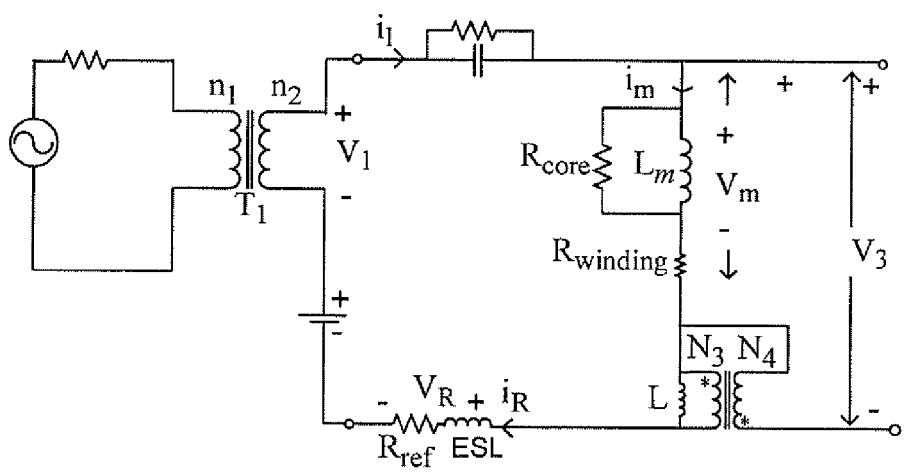
FIG. 20 is a schematic diagram of a an exemplary inductor loss test circuit including DC flux bias in accordance with the invention

In the interest of completeness, it should be kept in mind that core loss is one part of the inductor loss. In many practical applications, designers want to know the total loss (or equivalent resistance) of the inductor or transformer under practical waveform conditions, like rectangular voltage waveform and DC current bias. However, at high frequency or where high frequency components are present in the excitation waveform, the conventional method still face the same problems as described above. To avoid those problems, the method and apparatus of the invention as discussed above can be slightly modified to satisfy measurement of total inductor loss with good accuracy. An embodiment of the invention for measurement of total inductor losses is shown in FIG. 19. Since core loss need not be isolated in this case, the transformer of the core-under-test in FIG. 13 is replaced by an inductor wound on the core-under-test. Thus the measured loss is the total loss consumed on the inductor, including winding loss and core loss. Similarly, replacing the transformer in FIG. 16 with an inductor wound on the core-under-test as shown in FIG. 20, the circuit can test the inductor loss with DC bias. Of course, winding losses can also be isolated by additionally measuring core losses as discussed above and subtracting measured core losses from measured total inductor losses; either or both of such measurements being performed in accordance with the invention as described above.

In view of the foregoing, it is clearly seen that the invention provides for sufficiently accurate measurement of core losses, winding losses and/or total inductor or transformer losses, even under different operating conditions sufficient to cause significant change in core permeability, to support advances in inductor or transformer core design. Errors in measurement at high excitation frequencies or high frequency components of excitation waveforms are minimized or avoided and the magnitude of such measurement error, with or without DC flux bias, can be quantitatively evaluated.

While the invention has been described in terms of a several embodiment that may be preferred for different applications and measurement and excitation conditions, those skilled in the art will recognize that the invention can be practiced with modification within the spirit and scope of the appended claims.

Having thus described my invention, what we claim as new and desire to secure by Letters Patent is as follows:

1. A method of measuring losses in an inductor or transformer, said method comprising steps of
   resonating a winding of said inductor or transformer with a reactive component in a series resonant circuit with said winding to cancel a portion of a reactive voltage of a magnetizing inductance of said inductor or transformer, a value of said reactive component being chosen such that a phase difference between a measured voltage across said resonant circuit and a measured current in series with said resonant circuit is less than 80°, and
   integrating said measured voltage and said measured current.

2. The method recited in claim 1, wherein said phase difference is less than 30°.

3. The method as recited in claim 1, wherein said reactive component is a capacitor.

4. The method as recited in claim 3, wherein said capacitor comprises a plurality of discrete capacitors.

5. The method as recited in claim 3, wherein said capacitor is a variable capacitor.

6. The method as recited in claim 1, wherein said reactive component is an inductor.

7. The method as recited in claim 6, wherein said inductor comprises a variable inductor or tunable transformer.

8. The method as recited in claim 1, wherein said reactive component is an air core transformer.

9. The method as recited in claim 1, including a further step of
   applying a DC flux bias to said inductor.

10. A circuit for measuring core losses in an inductor or transformer having a core, said circuit comprising,
    a current sensor including a sensing winding to measure current through a winding of said inductor or transformer, and
    a reactive component connected to terminals of said sensing winding and said inductor or transformer and having a reactance value to resonate with said inductor or transformer such that a portion of a reactive voltage on said inductor or transformer is canceled and a phase difference of a voltage across said sensing winding and said current through said inductor or transformer is less than 80°.

11. The circuit as recited in claim 10, wherein
    said sensing winding is wound on said core and has one terminal of said sensing winding connected to a terminal of said inductor or transformer.

12. The circuit as recited in claim 10, wherein said phase difference is less than 30°.

13. The circuit as recited in claim 10, wherein said reactive component is a capacitor.

14. The circuit as recited in claim 10, wherein said reactive component is a variable capacitor.

15. The circuit as recited in claim 10, wherein said reactive component is an inductor.

16. The circuit as recited in claim 10, wherein said reactive component is an air core transformer.

17. The circuit as recited in claim 10, further including
    a further winding on said core, and
    a DC current source in series with said further winding.

18. The circuit as recited in claim 17, wherein said inductor or transformer winding, said sensing winding and said further winding are formed on two cores and respectively connected in series with said further windings being coupled with opposite polarity to portions of said inductor or transformer on respective cores.

19. The circuit as recited in claim 10, wherein said inductor and said sensing winding are formed by a bifilar winding on said core.

20. The circuit as recited in claim 10, further comprising
    a radio frequency excitation source, and
    an impedance transformer.

* * * * *